United States Patent [19]
Zarkov

[11] 4,195,268
[45] Mar. 25, 1980

[54] CRYSTAL OSCILLATOR INCLUDING ADJUSTABLE AUTO TRANSFORMER FOR NEUTRALIZING CRYSTAL CAPACITANCE

[75] Inventor: Sviataslov Zarkov, River Forest, Ill.

[73] Assignee: Motorola, Inc., Schaumburg, Ill.

[21] Appl. No.: 882,204

[22] Filed: Feb. 27, 1978

[51] Int. Cl.² .......................... H03B 5/36; H03C 3/22
[52] U.S. Cl. ............................ 331/116 R; 331/177 V; 332/26; 332/30 V
[58] Field of Search .......................... 334/74, 75, 76; 331/116 R, 181, 1.77 V; 332/26, 30 V

[56] References Cited

U.S. PATENT DOCUMENTS

| | | | |
|---|---|---|---|
| 3,223,953 | 12/1965 | Pawlowski | 331/136 |
| 3,299,356 | 1/1967 | Bornhorst et al. | 331/116 R |
| 3,367,816 | 2/1968 | Mills et al. | 334/74 |
| 3,457,529 | 7/1969 | Merdian, Jr. | 331/116 R |
| 4,001,724 | 1/1977 | Keller | 331/116 R |
| 4,038,595 | 7/1977 | Wachter | 331/181 |

OTHER PUBLICATIONS

Electronics, Smith, pp. 76–77, Nov. 13, 1959.
Radio Communication, Lean, pp. 614–619, Aug. 1975.
P. Wireless, Dowdeswell, pp. 41–43, May, 1972, vol. 48, No. 1.

Primary Examiner—Siegfried H. Grimm
Attorney, Agent, or Firm—James W. Gillman; Edward M. Roney; James S. Pristelski

[57] ABSTRACT

In a high frequency oscillator circuit, or other high frequency circuit, utilizing a crystal, the physical capacitance $C_o$, of the crystal may be neutralized and the impedance match of the crystal to the remaining circuit achieved over a range of variations in the crystal and varacter parameters by connecting two inductance coils as an auto transformer and disposing them in end to end relationship on a common form across the crystal with a movable metallic slug interiorly thereof for varying the reactance of one coil relative to the other to achieve the desired deviation to reactance response. The overall reactance of the auto transformer remains constant and thus the $C_o$ compensation is not altered.

3 Claims, 6 Drawing Figures

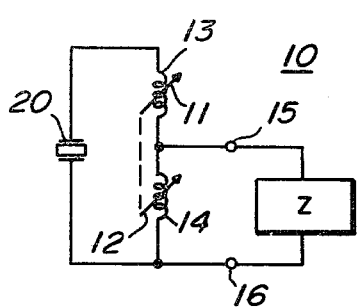
_Fig. 1_
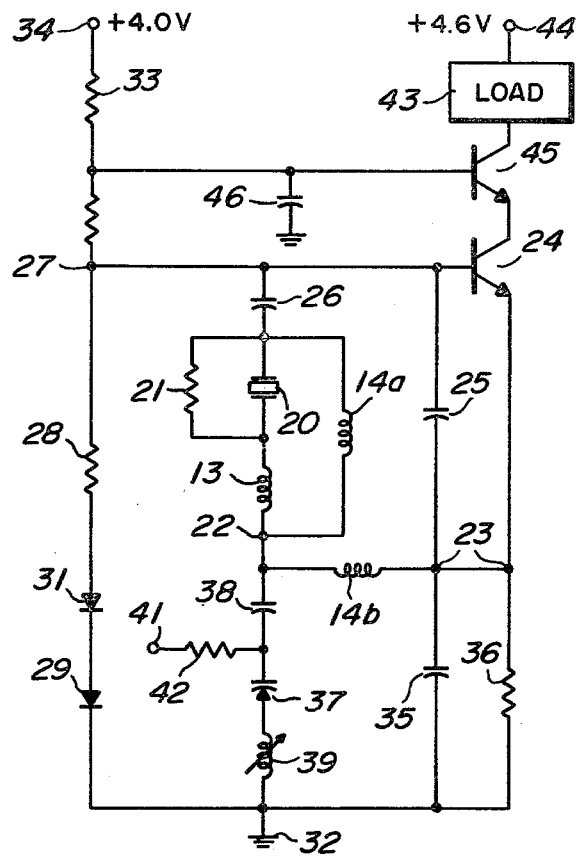
PRIOR ART
_Fig. 2_
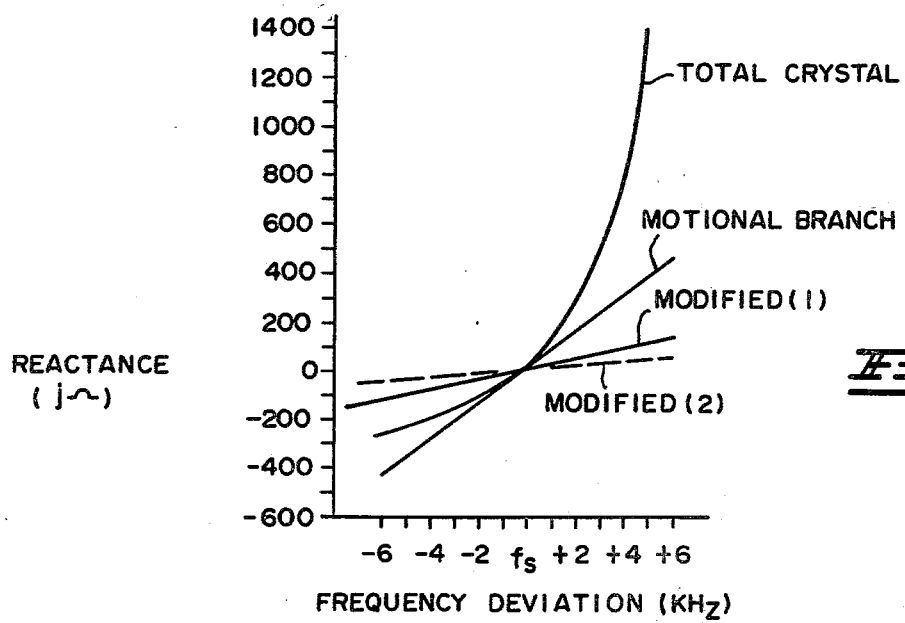
_Fig. 3_

CRYSTAL OSCILLATOR INCLUDING ADJUSTABLE AUTO TRANSFORMER FOR NEUTRALIZING CRYSTAL CAPACITANCE

BACKGROUND OF THE INVENTION

The invention relates to high frequency networks, more particularly to variable oscillators, operating at relatively high frequencies, such as colpitts oscillators. Such oscillators, or similar networks, include crystals in the frequency controlling circuits, tank circuits in the case of an oscillator, and a variable impedance in this circuit for determining the warp range, or operating range, of the oscillator. Voltage variable capacitors are ordinarily used in these circuits so that the frequency of the oscillator can be controlled by a remotely generated voltage. The range of voltage variable capacitors is limited and, until relatively recently, it has been difficult to obtain the desired warp range for the oscillator when using the voltage variable capacitor.

When the relatively wide warp range was obtained in crystal oscillators, difficulties have arisen because of the crystal having a tendency to be nonlinear when utilized over such a frequency range. The nonlinearly was caused by the physical capacitance $C_o$, of the crystal and was improved by neutralizing the $C_o$ as by the appropriate connection thereto of an inductance coil. The tendency of the oscillator to oscillate at spurious modes, that is to be unstable, was largely overcome by the use of additional inductance coils appropriately connected.

These problems of the prior art have largely been solved by the invention disclosed in the U.S. Pat. No. 4,001,724, Anthony F. Keller, entitled "Variable High Frequency Crystal Oscillator," issued Jan. 4, 1977, and assigned to the same assignee as the present invention. In the Keller patent a pair of inductance coils are provided which are connected together and across the crystal in the circuit for neutralizing the $C_o$ of the crystal and by connecting the juncture between the two coils to one terminal of the remainder of the tank circuit for impedance matching purposes.

Knowing the impedance of the crystal and the impedance of the remaining network, tank circuit, the principles of the Keller U.S. Pat. No. 4,001,724 enabled the selection of two inductances to achieve the indicated purposes.

In variable high frequency crystal oscillators, such as disclosed in Keller, the frequency variation, or deviation range, of the oscillator, has been determined by varying the capacitance of a voltage variable capacitor, or varactor. While a high degree of accuracy is maintainable in the manufacture of crystals, varactors, and inductance coils, there is nevertheless a permissible tolerance in the manufacture of these components as well as of others. When the crystal, the varactor and the inductance coils, etc. are assembled together it is necessary, of course, that the resulting frequency deviation characteristic relative to the reactance variation producing it be within prescribed specifications. This is done by the appropriate selections of the two inductance coils referred to. If when assembled, the resulting circuit has the desired sensitivity, that is the proper relationship between reactance variations and frequency deviation, the resulting circuit is within specifications and is correct. But if not, the only alternative is to make a different selection of the two inductance coils and this presents a time consuming expensive, and largely unacceptable, procedure.

SUMMARY OF THE INVENTION

It is an object of the invention to provide an improved high frequency crystal oscillator, or other high frequency network, that eliminates the indicated difficulties and shortcomings of the prior art.

According to the subject invention, when the two inductances or coils are selected and connected across the crystal for neutralizing the physical capacitance, $C_o$, thereof and the juncture of the two coils is connected to the appropriate point in the remaining part of the tank circuit, the relative reactances of the two coils may be adjusted, while the total reactance of the two coils together remains constant.

In this way the physical capacitance, $C_o$, remains neutralized and the impedance matching between the crystal network and the remaining portion of the tank circuit can be adjusted to achieve the "in specification" condition of reactance relative to frequency deviation. In net effect, the two inductance coils are wound on the same coil form as an auto transformer, the extremities of the two coils connected together are connected across the crystal and the juncture between the coils is brought out as a tap on the auto transformer and is connected to the appropriate point in the remaining portion of the tank circuit. A movable slug of aluminum, for example, is threadedly disposed inside of the form on which the coils are wound and is movable therein so as to vary the reactance of one winding relative to the other while not disturbing the total reactance of the two windings together. The metal slug must be sufficiently small so as always to remain within the confines of the two windings together.

In carrying out the invention according to one form there is provided in a high frequency network means for maintaining a constant reactance across two terminals while at the same time enabling the ratio of two reactances to vary relatively, comprising an auto transformer having first and second windings disposed end to end on a common form, the first and second windings corresponding to respective ones of the two reactances and movable metallic slug having linear dimensions less that the linear dimension of either of the first and second windings disposed inside of the form, the movability of the slug being between the extremities of the end to end windings whereby the reactance across the extremities remain constant and the reactance of one of the windings varys relative to the reactance of the other of the windings according to the position of the slug.

In carrying out the invention according to another form there is provided in a variable, high frequency crystal oscillator including an oscillator having a tank circuit, first and second inductance means, means for coupling the first and second inductance means into the tank circuit and impedance varying means coupled into the tank circuit for varying the frequency of oscillation thereof, the improvement comprising; an auto transformer having the first and second inductance means as windings thereof, the first and second inductance means being disposed end to end on a common form, and a movable metallic slug having linear dimensions less than the linear dimensions of the inductances disposed inside of the form, the movability of the slug being between the extremities of the winding.

It is a further object of the invention to provide an apparatus and a method for enabling the adjustment of the frequency deviation relative to the reactance achieving it in a variable frequency oscillator or network after the components such as the crystal, varactor, and inductance coils have been assembled together.

BRIEF DESCRIPTION OF THE DRAWINGS

FIG. 1 is a schematic diagram illustrating an embodiment of the neutralizing and impedance transforming network combined with a crystal, according to the prior art, FIG. 4 of U.S. Pat. No. 4,001,724, and schematically illustrating the present invention;

FIG. 2 is a schematic diagram of a high frequency oscillator according to the prior art, FIG. 6 of U.S. Pat. No. 4,001,724;

FIG. 3 is a graphic representation of the frequency deviation of the crystal versus reactance change of the circuit with and without neutralization and impedance transformation and corresponds to FIG. 5 of U.S. Pat. No. 4,001,724 with an addition according to the subject invention.

DESCRIPTION OF THE PREFERRED EMBODIMENT OF THE INVENTION

Figure 5:
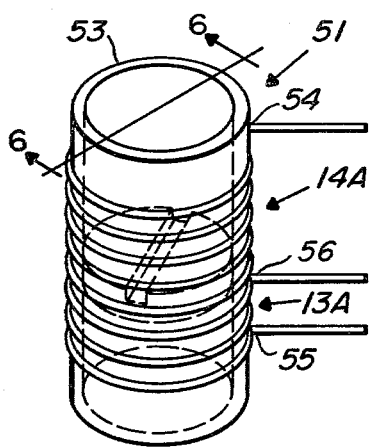
FIG. 5 is a perspective view of the two coils formed as an auto transformer according to the invention.
Figure 4:
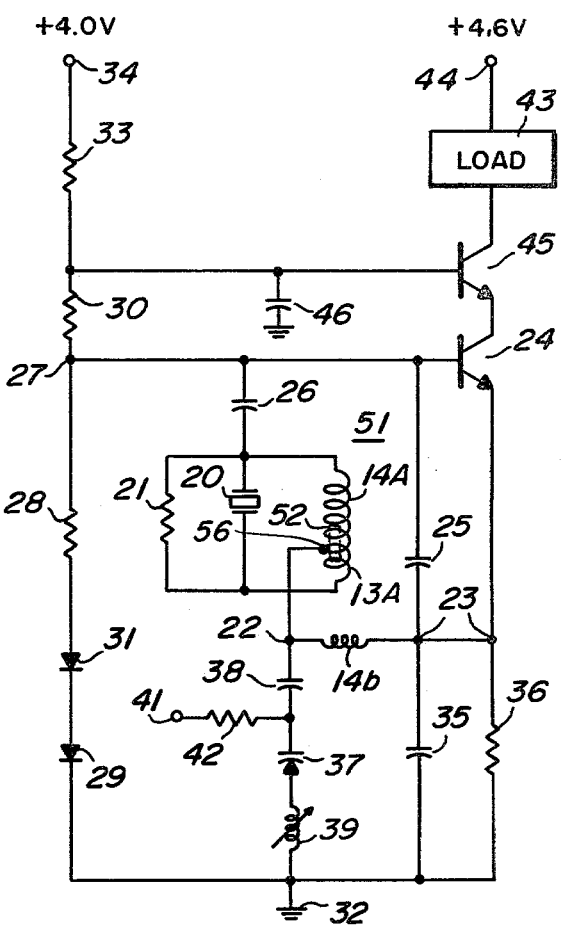
FIG. 4 is a circuit diagram similar to that of FIG. 2 illustrating the subject invention.
Figure 6:
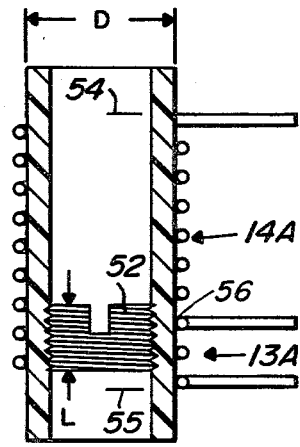
FIG. 6 is a sectional view of the auto transformer illustrated in FIG. 5.

Referring to the drawings, FIGS. 1, 2 and 3 are the same as FIGS. 4, 6 and 5 of U.S. Pat. No. 4,001,724 with the exception of the modifications in FIGS. 1 and 3 according to the invention of this application. These figures are reproduced here in the interest of expeditiously explaining the background of the invention and the understanding of it because the invention disclosed in the subject application is, in essence, an improvement upon that illustrated in the patent referred to. The neutralizing and impedance transforming network 10 of FIG. 1, other than the inductance adjusting mechanism 11, 12 for inductances or coils 13 and 14, respectively, is the same as that of FIG. 4 of U.S. Pat. No. 4,001,724 and the explanation given there is fully applicable here.

For convenience sake, the output terminals 15 and 16 of network 10, appearing across winding 14 and connected to the external load Z are the same reference characters given in the patent. Similarly, the crystal will be identified by the reference character 20 for convenience in associating it with the patent. But, it will be understood that the crystal 20 is exemplary of any other network whose capacitance is to be neutralized by the inductance of windings 13 and 14 and the impedance transformation, as between the crystal 20 and the impedance Z, is dependent upon the relative inductances of the windings 13 and 14. The frequency versus reactance relationship of the crystal is a measure of its sensitivity and this sensitivity must be relatively constant for most applications i.e. crystal oscillators and the like. Crystals generally exhibit a high degree of nonlinearity, which can be greatly improved by cancelling $C_o$ thereof. The $C_o$ of a crystal can be cancelled by placing a properly selected inductor, combined coils 13 and 14, in parallel therewith as explained in the patent referred to. Thereafter the crystal sensitivity is extremely linear.

The nonlinearity of a crystal prior to neutralization of $C_o$ is illustrated graphically in FIG. 3 by the curve labeled "Total Crystal" and the approved sensitivity or linearity of the crystal is graphically represented by the curve represented "Motional Branch". The inductance of the coils 13 and 14 can be chosen so that the $C_o$ is neutralized and the desired impedance transformation takes place. With the coils 13 and 14 neutralizing the $C_o$ of the crystal 20 and providing impedance transformation between the crystal and the output terminals 15 and 16, the frequency deviation versus reactance curve of the crystal 20 is adjusted to the curve labeled "Modified (1)".

It will be noted, by referring to FIG. 3, that a one kHz deviation of the frequency of the crystal not having the impedance transforming network connected thereto (but with $C_o$ neutralized) requires approximately a 75 ohm reactance change. However with a four to one impedance transformation network connected to the crystal a one kHz change in frequency is obtained with a 19 ohm change in reactance. In an oscillator where a frequency deviation of, for example, plus or minus 3 kHz may be desired, this reduces the required reactance change from plus or minus 225 ohms to plus or minus 57 ohms. When a high frequency oscillator, i.e. 50 mHz is being utilized, a 225 ohm impedance change is extremely difficult but a 57 ohm reactance change is practical.

Referring to FIG. 2, a high frequency crystal oscillator according to the prior art, FIG. 6 of U.S. Pat. No. 4,001,724, is illustrated wherein neutralizing and impedance transforming inductances are connected to the crystal as described. This circuit will be described here, as in the U.S. Pat. No. 4,001,724, but with different reference characters for most corresponding parts as the simplest manner of giving needed background for the present invention.

The crystal 20 is connected in series with the single coil 13 of the first inductance and a resistor 21 is connected in parallel with the crystal 20. The second inductance includes a first coil 14a and a second coil 14b. Coil 14a is connected in parallel with the series combination of the crystal 20 and the coil 13. One end of the second coil 14b is connected to the junction 22 of the coils 13 and 14a and the other end of the coil is connected to a junction 23. The junction 23 is connected directly to the emitter of an npn type transistor 24 and through a capacitor 25 to the base of transistor 24. The base of the transistor 24 is also connected to a small DC blocking capacitor 26 to the junction of the crystal 20 and the coil 14a, and to a bias junction 27. Junction 27 is connected to a series combination of resistor 28 and a pair of diodes 29 and 31 to ground 32. Junction 27 is further connected through a resistor 33 to a terminal 34 adapted to have a positive voltage (in this embodiment plus 4 volts) applied thereto. A capacitor 35 and resistor 36 are connected in parallel between the terminal 23 and ground 32. The capacitors 25 and 36 forms split capacitors for a Colpitts type oscillator.

An impedance generator, which in this embodiment is a voltage variable capacitor 37, is connected in series with a capacitor 38 and a variable coil 39 between ground 32 and the junction 22 to complete the oscillator circuit. Although specific circuitry is illustrated for varying the voltage across the voltage variable capacitor 37 (varactor) to change the frequency of the oscillator, it should be understood that any convenient modulating circuit might be attached thereto as, for example, between a terminal 41 and ground. Terminal 41 is connected through a resistor 42 to a junction between capacitor 38 and the voltage variable capacitor 37. The output of the oscillator is applied to a load 43, which is connected between a terminal 44 adapted to have a positive voltage applied thereto (in this embodiment 4.6 volts) and the collector of an npn type transistor 45. The emitter of the transistor 45 is connected directly to the collector of the transistor 24 and the base is connected through a resistor 33 to the positive voltage terminal 34. A bypass capacitor 46 is connected from the base of the transistor 45 to ground.

The circuit illustrated is a Colpitts type oscillator designed to operate on the third overtone of the crystal 20 at approximately a $F_s$ of 50 mHz (where $F_s$ is the frequency at which the motional branch of the crystal is at series resonance). The crystal 20, capacitor 26, capacitor 25, capacitor 35, voltage variable capacitor 37, capacitor 38, coil 39, coil 13 and coils 14a and 14b form the tank circuit of the oscillator with a first and second inductances (coils 13, 14a and 14b) providing the neutralization of the crystal 20 and the impedance transformation between the crystal 20 and the remainder of the tank circuit which operates as a load for the crystal 20. The coils 14a and 14b are effectively in parallel even though the coil 14b is connected in series with the one split capacitor 25 and the series combination is coupled in parallel with the first coil 14a of the second inductance. The DC blocking capacitor can be practically ignored because of its size relative to the remaining components.

The modified (1) graph of FIG. 3 represents the improved sensitivity response for particular values of inductance for coils 13 and 14a, crystal 20, varactor 37 and the other components of the circuit. Each of these components has a manufacturing tolerance and while selectivity is exercised in choosing them, it is nevertheless a real probability that the response "Modified (1)" will not have the precisely desired slope, that is to say be completely within specification. As indicated above the only prior way in which the "Modified (1)" response can be changed is to replace the coils 13 and 14a appropriately, or to replace the crystal, the varactor, or some other component. This is manifestly expensive and unsatisfactory.

It has been found that the foregoing disadvantage can be eliminated, according to the invention by disposing the windings 13 and 14a on a common form as an auto transformer with the juncture between the windings brought out as a tap on the auto transformer and a movable slug disposed inside of the transformer for adjustability purposes. Thus, referring to FIG. 4 the windings 13A and 14A are shown connected together as an auto transformer and are connected across the crystal 20, windings 13A and 14A being joined at the tap 56 which is connected to the terminal 22 of the circuit which is otherwise identical to the circuit of FIG. 2 already described.

Referring to FIGS. 5 and 6 the auto transformer 51 is shown as comprising a hollow form 53 of an appropriate diameter and of an insulating material, preferably one of the synthetic insulating materials which will withstand high temperature upon which there are formed windings or coils, inductances, 13A and 14A. The tap 56 is formed at the desired point so that the coil 13A and the coil 14A each have the proper inductance and thus reactance as is well understood. Interiorly of the form 53 there is a metallic slug 52 which may be threaded so that it can be positioned at different locations. The slug may be formed of any desired metal, for example, ferrite or aluminum and in a particular case an aluminum slug was used. The linear dimension of the slug 52 is such that it remains within the extremities 54 and 55 of the coils at all times. The position of the slug 52 changes the flux distribution with respect to the turns of the coils but it does not change the total reactance of the two coils 13A and 14A together. That is, while the flux linkages may change in their distribution the total effect thereof remains constant across the extremities 54 and 55 of the coils together.

Ordinarily the slug 52 might be positioned in the vicinity of the tap 56 so that relatively small movements of the slug would affect the flux linkages as between the coil 13A and 14A more directly. However, since the dimensions of the overall coil, that is its diameter, its length between the extremities 54 and 55, that is to say, including all of the turns of coils 13A and 14A, remain the same irrespective of the position of the slug 52, and the permeability of the slug remains the same, the overall reactance of the coils 13A and 14A remains constant irrespective of the position of the slug 52. Thus when coils 13A and 14A have been selected, as in U.S. Pat. No. 4,001,724, the $C_o$ of the crystal 20 will be neutralized. If in the selection process the tolerances of the varactor 38, for example, or of the crystal 20 itself, are such that the impedance match to the circuit is not that desired, which for example might be shown by the graph "Modified (1)" of FIG. 3, the circuit may be adjusted by changing the position of the slug 52. Changing the position of slug 52 varies the flux linkages in connection with the windings 13A and 14A and thus causes a change in the impedance match to the circuit as is well understood, while however, leaving the total reactance across the extremities of the coil the same. By changing the position of the slug 52 the sensitivity of the crystal may be changed to a response curve such as "Modified (2)" of FIG. 3 which would be the precise specification desired. Thus by changing the position of the slug 52, always within the extremities of the windings 13A and 14A, the overall reactance of the windings remains the same but the ratio between the reactance of winding 13A to 14A is changed. Complete neutralization of the $C_o$ of the crystal is thereby obtained while the impedance match to the circuit may be modified in order to obtain the desired sensitivity.

The slug 52 is slotted so that a screw driver may be used to adjust its position. The material of the slug is related to the frequency used and the size of coil desired. At 50 mHz aluminum was preferable to ferrite, for example.

It may be preferably in some instances that the windings 13A and 14A be formed as a single layer on the form 53.

Typical values for the various components in the illustrated embodiments are listed below.

| Inductances | | Capacitances | |
| --- | --- | --- | --- |
| 13A | .50μh | 25 | 75Pf |
| 14A | .90μh | 26 | 1000 Pf |
| 14b | 1.6 μh | 35 | 75 Pf |
| 39 | 1.0 μh | 38 | 220 Pf |
| | | 46 | 1000 Pf |

Varicap 38 - MV109

| Resistors | |
| --- | --- |
| 21 | 2.7KΩ |
| 28 | 5 KΩ |
| 30 | 10 KΩ |
| 36 | 220 KΩ |
| 33 | 10 KΩ |
| 42 | 100 KΩ |

Transistors 24 & 45 M957

The constants of the transformer 51 in one particular case were: Diameter D is 0.066 inch, length between 54 and 55 is 0.20 inch, number of turns in 13A is 16¾, the wire size is No. 38 AWG., the diameter of slug 52 is 0.056 inch to 0.060 inch and the length L of the slug is 0.09 inch. The material of the form 53 was a commercially available synthetic known under name of Kapton.

Thus, a variable high frequency crystal oscillator, or other network, is disclosed which has good crystal sensitivity due to the neutralization of $C_o$. Further, the oscillator is variable over a wide range utilizing commercially available voltage variable capacitors and crystals and the oscillator is stable over a relatively wide range of frequency adjustment. The specific embodiments and values of the components at frequencies described are simply for exemplary purposes and different operating frequencies will require different component values.

While I have shown and described specific embodiments of this invention, improvements will occur to those skilled in the art. It is understood, therefore, that this invention is not limited to the particular form shown and it is intended that the claims cover all modifications which do not depart from the spirit and scope of the invention.

I claim:

1. In a variable, high frequency crystal oscillator including an electronic tank circuit comprising a crystal and a pair of capacitors connected in series and coupled to said crystal, said crystal having a physical capacitance, $C_o$; first and second inductance means; means for coupling the first and second inductance means into the tank circuit for neutralizing the physical capacitance, $C_o$, of the crystal and for providing an impedance transformation between the crystal and the remainder of the tank circuit; and impedance varying means coupled into the tank circuit for varying the frequency of oscillation thereof, the improvement comprising:

an auto transformer having said first and second inductance means as windings thereof with a tap at their juncture, said first and second inductance means being disposed end to end on a common form, and a movable metallic slug having linear dimensions less that the linear dimensions of said inductance means disposed inside of said form, said metallic slug being movable between the extremities of said inductance means, the extremities of said inductance means being coupled across said crystal and the tap and the extremity of one of said inductance means being coupled into said tank circuit.

2. The oscillator according to claim 1 wherein said first and second inductance means comprise a single layer winding.

3. The oscillator according to claim 1 wherein said movable slug comprises aluminum.

* * * * *